US008530760B2

United States Patent
Taylor

(10) Patent No.: US 8,530,760 B2
(45) Date of Patent: Sep. 10, 2013

(54) ELECTRONIC DEVICE INCLUDING INDIUM GASKET AND RELATED METHODS

(75) Inventor: Edward Allen Taylor, Melbourne, FL (US)

(73) Assignees: SRI Hermetics, Inc., Melbourne, FL (US); H-Tech, LLC, West Melbourne, FL (US)

( * ) Notice: Subject to any disclaimer, the term of this patent is extended or adjusted under 35 U.S.C. 154(b) by 96 days.

(21) Appl. No.: 13/346,009

(22) Filed: Jan. 9, 2012

(65) Prior Publication Data

US 2013/0175084 A1    Jul. 11, 2013

(51) Int. Cl.
*H01L 23/02*    (2006.01)
*H05K 5/06*    (2006.01)

(52) U.S. Cl.
USPC ........................................... 174/563; 174/564

(58) Field of Classification Search
USPC .................. 174/563, 564, 367, 368
See application file for complete search history.

(56) References Cited

U.S. PATENT DOCUMENTS

| | | | |
|---|---|---|---|
| 3,296,356 A * | 1/1967 | McAdams ..................... 174/367 |
| 3,304,360 A * | 2/1967 | Hadley et al. ................. 174/367 |
| 4,507,520 A * | 3/1985 | Lindgren ....................... 174/368 |
| 5,285,007 A * | 2/1994 | Deluca et al. ................. 174/387 |
| 5,369,267 A | 11/1994 | Johnson et al. ............... 250/214 |
| 5,382,753 A * | 1/1995 | Farley .......................... 174/563 |
| 6,549,426 B1 * | 4/2003 | Lawlyes et al. ............... 361/816 |
| 6,822,161 B2 * | 11/2004 | Komatsu et al. .............. 174/367 |
| 6,837,766 B2 | 1/2005 | Costello ......................... 445/24 |
| 7,331,801 B1 | 2/2008 | Eichorn .......................... 439/79 |
| 7,491,898 B2 * | 2/2009 | Villanella ..................... 174/368 |
| 7,563,992 B2 * | 7/2009 | Lawlyes et al. ............... 174/561 |
| 8,076,576 B2 * | 12/2011 | Kumatani et al. .......... 174/50.51 |
| 2002/0112870 A1 * | 8/2002 | Kobayashi et al. ............. 174/50 |
| 2003/0178217 A1 * | 9/2003 | Wang et al. .................. 174/52.3 |
| 2007/0024011 A1 | 2/2007 | Michaud et al. ............... 277/628 |
| 2008/0053700 A1 * | 3/2008 | O'Connor et al. ............ 174/564 |
| 2008/0105558 A1 | 5/2008 | Cohen et al. ................. 205/170 |

* cited by examiner

Primary Examiner — Hung Ngo
(74) Attorney, Agent, or Firm — Allen, Dyer, Doppelt, Milbrath & Gilchrist, P.A.

(57) ABSTRACT

An electronic device may include electronic circuitry and a housing carrying the electronic circuitry. The housing may include first and second metallic housing members having opposing first and second mating surfaces respectively defining a projection and a corresponding recess. The projection may be spaced inwardly from a perimeter of the first housing member, and the recess may be spaced inwardly from a perimeter of the second housing member. The electronic device may further include a gasket between the opposing first and second mating surfaces and extending outwardly to perimeters of the first and second mating surfaces. The gasket may include indium.

24 Claims, 7 Drawing Sheets

ELECTRONIC DEVICE INCLUDING INDIUM GASKET AND RELATED METHODS

FIELD OF THE INVENTION

The present invention relates to the field of electronics, and, more particularly, to electronics housings and related methods.

BACKGROUND OF THE INVENTION

An electronics housing is typically in the form of a box-like structure, in the interior of which electronic circuitry is mounted. The electronics housing is desirably constructed from materials that meet specific functional requirements for density, thermal expansion, thermal conductivity, mechanical strength, and the like. For example, an electronics device used in aircraft and spacecraft may be lightweight and therefore may be constructed from low-density materials.

Additionally, in some environments, a hermetic seal of the electronics housing may be desirable. In other words, it may be desirable for the electronic circuitry within the electronics housing to be in a vacuum. A gasket may be used to provide the hermetic seal between members of the electronics housing.

Mechanical fasteners, for example, bolts, positioned along the perimeter of the electronics housing may also be used with the gasket to provide and secure the hermetic seal. For example, U.S. Patent Application No. 2007/0024011 to Michaud et al. discloses a thermally stable vacuum enclosure seal design for $C_{O2}$ lasers. More particularly, Michaud et al. discloses a housing and an end flange coupled to the housing. An indium wire seal is placed between a tongue of the end flange and a groove formed in an open end of the housing to provide a hermetically sealed environment. Bolts secure the end flange to the housing along a perimeter. Unfortunately, to access the electronic circuitry within the electronics housing, the bolts must be removed.

U.S. Pat. No. 5,369,267 to Johnson et al. discloses an intensifier tube that includes a housing having faceplates in the form of glass windows. The glass windows seal interior components within a vacuum via a ring of indium that contacts an interface between each of the windows and the housing.

SUMMARY OF THE INVENTION

In view of the foregoing background, it is therefore an object of the present invention to provide an electronic device that provides a seal to electronic circuitry and allows efficient access thereto.

This and other objects, features, and advantages in accordance with the present invention are provided by an electronic device that may include electronic circuitry and a housing carrying the electronic circuitry. The housing may include first and second metallic housing members having opposing first and second mating surfaces respectively defining a projection and a corresponding recess, for example. The projection may be spaced inwardly from a perimeter of the first housing member, and the recess may be spaced inwardly from a perimeter of the second housing member, for example. The electronic device may include a gasket between the opposing first and second mating surfaces and extending outwardly to a perimeter of at least one of the first and second mating surfaces. The gasket may include indium. Accordingly, the electronic device may advantageously provide an increased housing seal and increased access to electronic circuitry by not including bolts, for example.

The opposing first and second mating surfaces may diverge outwardly from one another adjacent respective perimeters of the first and second metallic housing members. The projection may have a triangular profile, for example. The triangular profile may have an inner leg at a right angle to adjacent portions of the first mating surface.

The first and second mating surfaces may include first and second continuous mating surfaces. The projection and corresponding recess may include, respectively, a continuous ring-shaped projection and a continuous ring shaped recess, for example. The gasket may include a continuous ring shaped gasket.

At least one of the first and second metallic housing members may include a body including a first metal and a coating layer on the body and including a second metal different than the first metal, for example. At least one of the first and second metallic housing members may further include a vacuum pressure port therein.

Each of the first and second metallic housing members may include at least one of aluminum, titanium, nickel, stainless steel, and an iron-nickel alloy. The electronic circuitry may include an infrared camera, for example. At least one of the first and second metallic housing members may include a frame and a light transmissive material window therein aligned with said infrared camera.

A method aspect is directed to a method of making an electronic device. The method may include forming a housing to carry electronic circuitry. The housing may include first and second metallic housing members having opposing first and second mating surfaces respectively defining a projection and a corresponding recess. The projection may be spaced inwardly from a perimeter of the first housing member, and the recess may be spaced inwardly from a perimeter of the second housing member. The method may further include positioning a gasket between the opposing first and second mating surfaces and extending outwardly to a perimeters of the first and second mating surfaces. The gasket may include indium.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
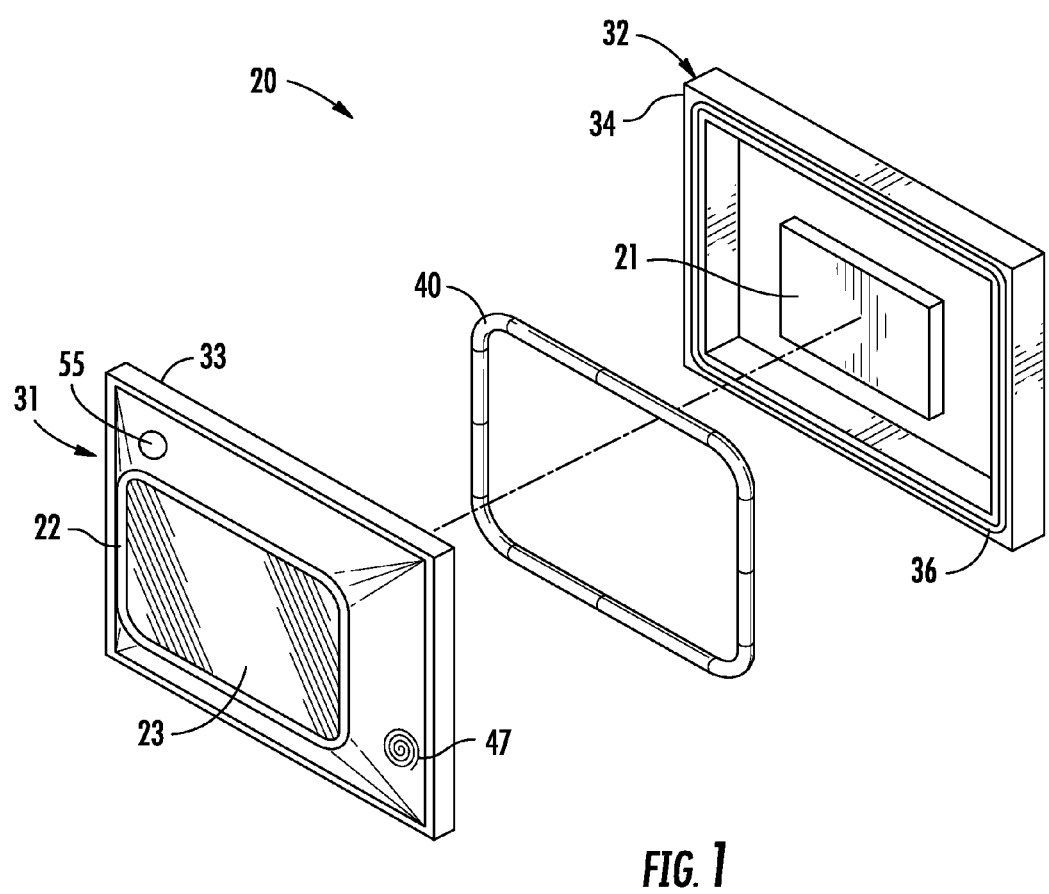
FIG. 1 is an exploded view of an electronic device in accordance with the present invention.
Figure 2:
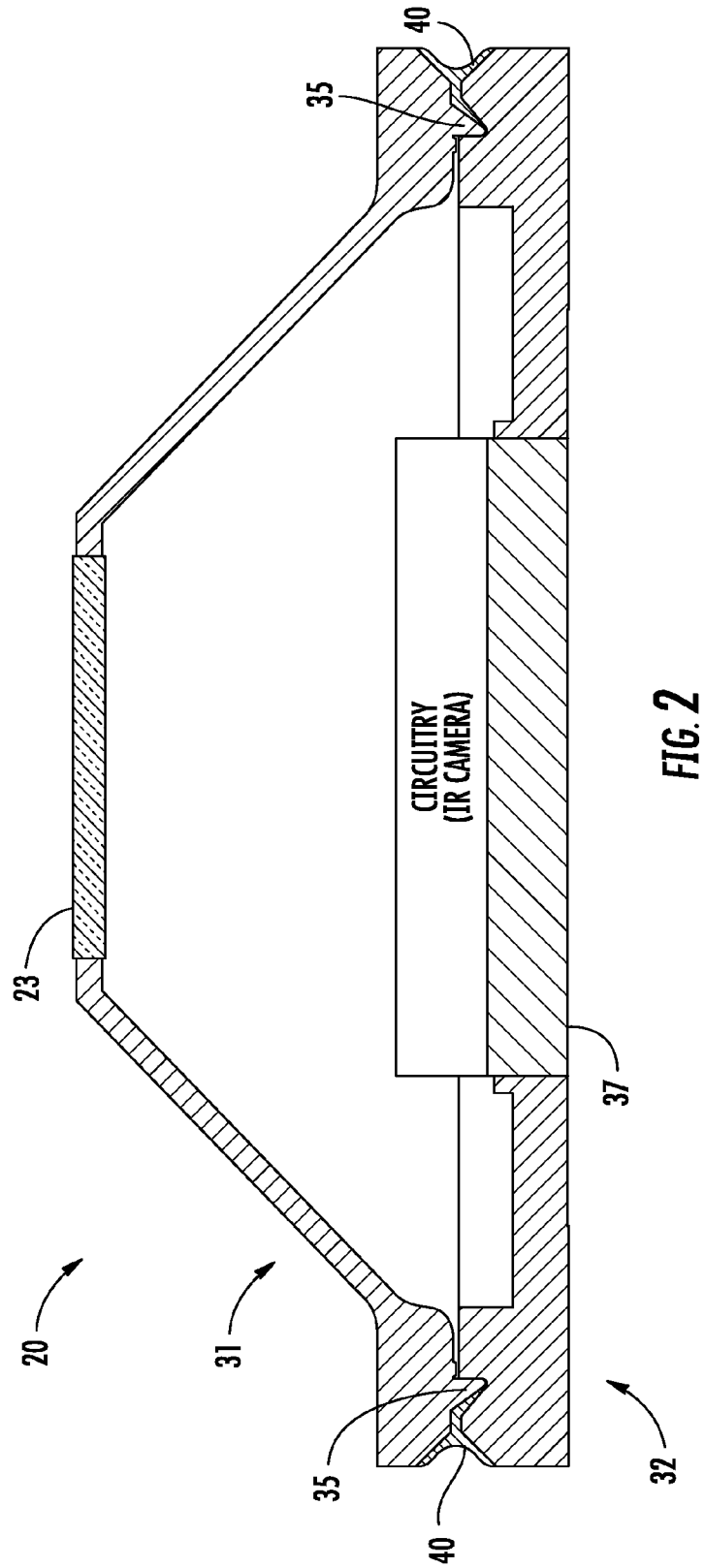
FIG. 2 is a cross-sectional view of the electronic device in FIG. 1 without the electronic circuitry.
Figure 3:
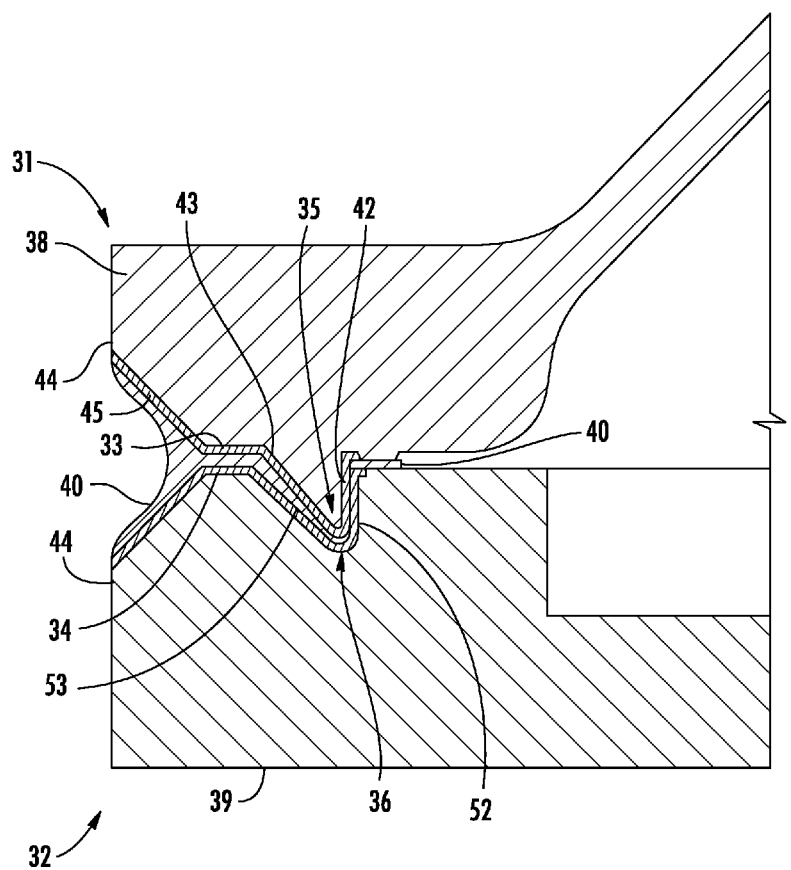
FIG. 3 is a cross-sectional view of a portion of the electronic device of FIG. 1.

Referring initially to FIGS. 1-3, an electronic device 20 includes electronic circuitry 21 and a housing 30 carrying the electronic circuitry. The electronic circuitry 21 may be in the form of a camera, and, more particularly an infrared camera. Other and/or additional circuitry may be included within the housing 30.

The housing 30 includes first and second metallic housing members 31, 32. The first and second metallic housing members 31, 32 each include a respective body 38, 39 that may include aluminum, titanium, nickel, stainless steel, and an iron-nickel alloy, alone or in combination, for example, with other metals or non-metals, as will be appreciated by those skilled in the art.

The second metallic housing member 32 or portion thereof may define a heat sink 37 (FIG. 2). For example, a portion of the second metallic housing member 32 adjacent the electronic circuitry 21 may be copper, and may advantageously remove heat from the electronic circuitry. Of course, in some embodiments, the second metallic housing 32 may not define a heat sink, or other materials may be used to define a heat sink. Moreover, it should be understood that the entire second metallic housing member 32 may define a heat sink, and not just a portion adjacent the electronic circuitry 21.

The first and second metallic housing members 31, 32 have opposing first and second mating surfaces 33, 34 respectively defining a projection 35 and a corresponding recess 36. Illustratively, the first and second mating surfaces 33, 34 are continuous mating surfaces. The first and second mating surfaces 33, 34 also illustratively diverge outwardly from one another adjacent the respective perimeters 44 thereof, as will be described in further detail below.

Additionally, the projection 35 and corresponding recess 36 are also continuous and in the shape of a ring. In some embodiments, one or more of the first and second mating surfaces 33, 34, and the projection 35 and corresponding recess 36 may not be continuous. The projection 35 is spaced inwardly from the perimeter 44 of the first metallic housing member 31. The corresponding recess 36 is also illustratively spaced inwardly from the perimeter 44 of the second metallic housing member 32.

The projection 35 illustratively has a triangular profile. More particularly, the projection 35 has an inner leg 42 extending at a right angle from adjacent portions of the first mating surface 33 (FIG. 3). Of course the inner leg 42 may extend at a different angle from adjacent portions of the first mating surface 33. The projection 35 also has an outer leg 43 that extends at an angle from adjacent portions of the first mating surface 33 to the inner leg 42 (FIG. 3).

Similarly, the corresponding recess 36 also has a triangular profile. More particularly, the second mating surface 34 includes an inner leg 52 extending at a right angle from adjacent portions of the second mating surface 34 (FIG. 3). Of course the inner leg 52 may extend at a different angle from adjacent portions of the second mating surface 34. The recess 36 also has an outer leg 53 that extends at an angle from adjacent portions of the second mating surface 34 to the inner leg 52 (FIG. 3). The angles at which the outer legs 43, 53 of the projection 35 and recess 36 extend from the respective mating surfaces 33, 34 are different so that the outer legs 43, 53 diverge from one another adjacent the respective mating surfaces. In other words, a gap is created between the outer legs 43, 53 which increases in size extending toward the perimeters of the first and second mating surfaces 33, 34 (FIG. 3).

The triangular profile of the projection 35 and the recess 36 may be particularly advantageous for alignment of the first and second metallic housing members 31, 32, for example, during assembly, as will be discussed in further detail below. Additional or other types of projections and recesses may be used as will be appreciated by those skilled in the art, for example, for further alignment.

The electronic device 20 also includes a gasket 40 between the opposing first and second mating surfaces 33, 34. The gasket 40 extends outwardly to the perimeters of the first and second mating surfaces 33, 34. Of course, in some embodiments, the gasket 40 may extend to the perimeter of one of the first and second mating surfaces 33, 34. The gasket 40 is also in the shape of a continuous ring. The gasket 40 may be other shapes, and may not be continuous, as will be appreciated by those skilled in the art.

The gasket 40 advantageously includes indium. As will be appreciated by those skilled in the art, the properties of the indium may make it particularly useful for use as part of the gasket. More particularly, the malleable and relatively low melting point of indium as compared to other metals make it particularly useful for forming a seal. The gasket 40 may also include a solder fill with the indium. The gasket may include other and/or additional metals or materials. It should be noted that in the case where the first and second housing members 31, 32 are aluminum or titanium, the aluminum or titanium should be plated, for example, with nickel. As will be appreciated by those skilled in the art, indium does not wet to aluminum or titanium without a plated surface.

A first coating layer 45 may be carried by the body 38 of the first metallic housing member 31. The first coating layer 45 may include indium, for example, for tinning the first mating surface 33 for coupling with the gasket 40, as will be appreciated by those skilled in the art. The first coating layer 45 may be another metal that is different from the body 38 of the first metallic housing member 31. A second coating layer 46 may also be carried by the body 39 of the second metallic housing member 32, and may include indium, or other type of metal, for tinning the second mating surface 34 for coupling with the gasket 40.

The first metallic housing member 31 may include a threaded blind hole 47. The threaded blind hole 47 is opened outwardly to an outer surface (FIG. 1). Of course, the second metallic housing member 32 may include the threaded blind hole, and/or the first and second metallic housing members 31, 32 may each include a threaded blind hole 47.

The threaded blind hole 47 advantageously allows for a corresponding threaded rod, for example, to be coupled with the threaded blind hole to provide increased leverage for separating the first and second housing metallic members 31, 32, particularly when mated or sealed with the gasket 40.

The first metallic housing member 31 also includes a vacuum pressure port 55 therein (FIG. 1). The vacuum pressure port 55 may be configured to evacuate air from within the housing 30, for example. As will be appreciated by those skilled in the art, the vacuum pressure port 55 may be capped, clamped, or pinched after drawing a vacuum. In other words, the vacuum pressure port 55 may be used to hermetically seal the housing 30. Of course, the second metallic housing member 32 may include the vacuum pressure port 55, and/or more than one vacuum pressure port may be included.

Additionally, where the electronic circuitry 21 is in the form of an infrared camera, the first metallic housing member 31 includes a frame 22 and a light transmissive material window 23 therein aligned with the infrared camera. The light transmissive material window 23 may be glass, plexiglass, or other light transmissive material (FIG. 1). Of course, the second metallic housing member 32 may include a frame and a light transmissive material window, as will be appreciated by those skilled in the art.

Figure 4A:
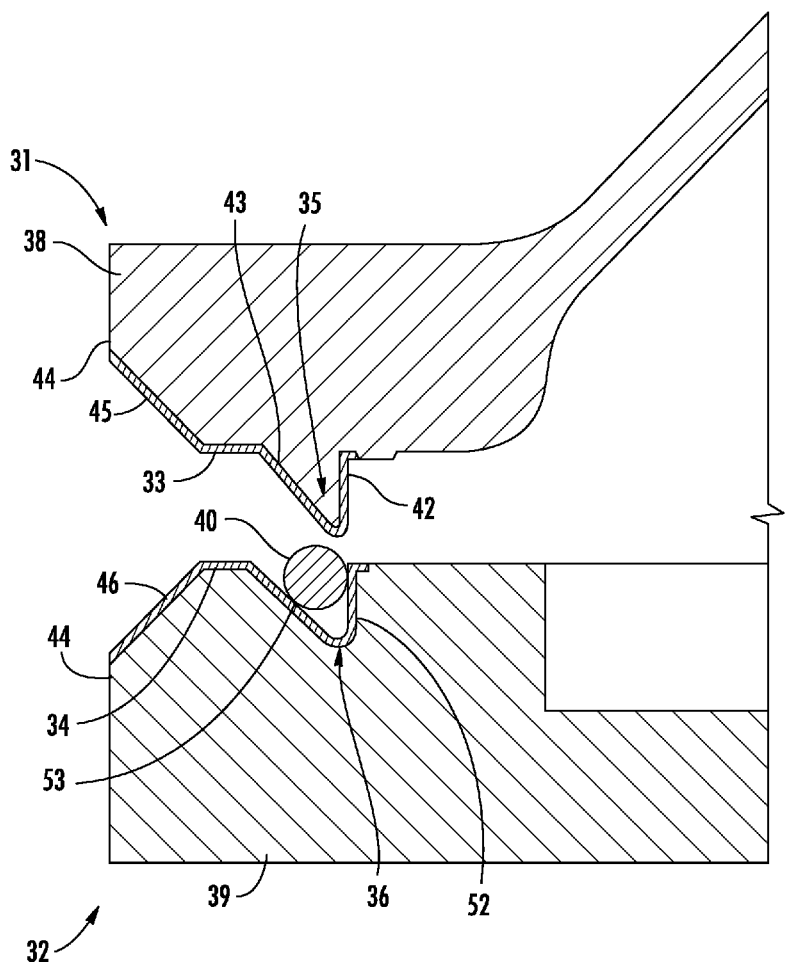
FIGS. 4a-4c are cross-sectional views of a portion of the electronic device of FIG. 1 during assembly thereof.
Figure 4B:
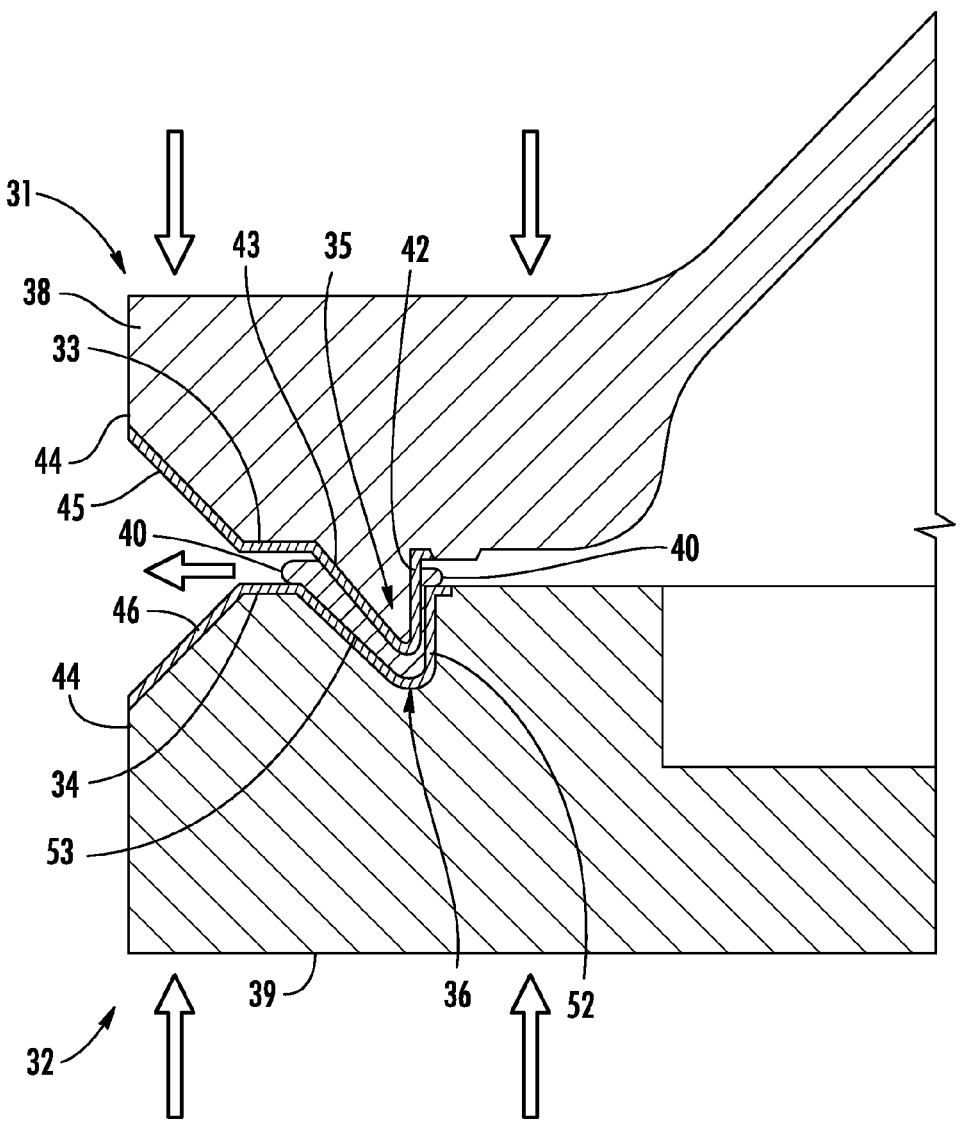
Figure 4C:
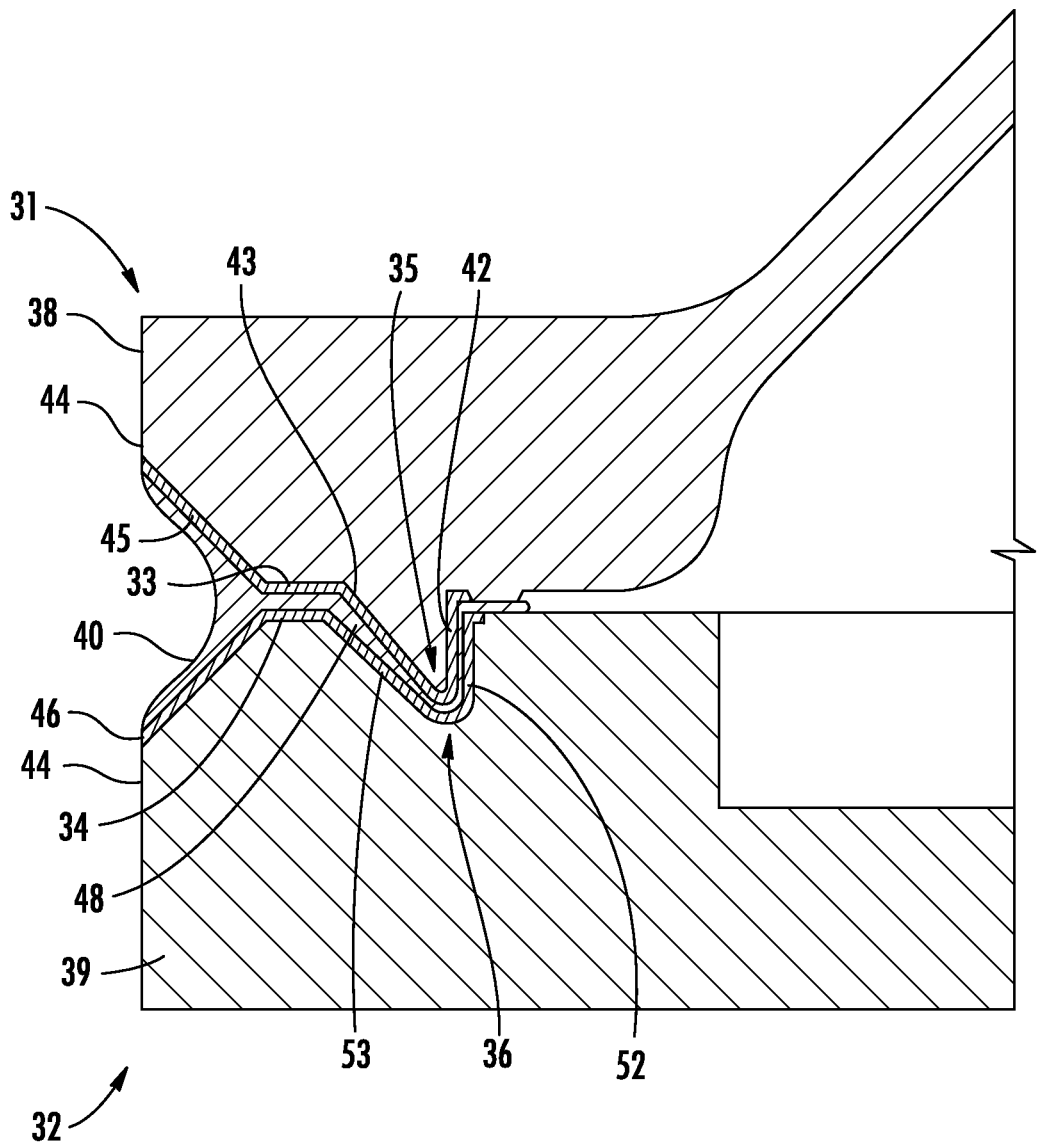

Referring now additionally to FIGS. 4*a*-4*c*, assembly of the electronic device 20 will now be described. The gasket 40, which may be in form of a continuous ring, is positioned between the opposing first and second mating surfaces 31, 32 (FIG. 4*a*). Illustratively, the gasket 40 is aligned with the projection 35 and the corresponding recess 36. In some embodiments, the gasket 40 may sit adjacent the recess 36 prior to mating the first and second metallic housing members 31, 32.

The first and second metallic housing members 31, 32 are advantageously mated, with the gasket 40 between the first and second mating surfaces 33, 34 (FIG. 4*b*). The projection 35 and the corresponding recess 36 are particularly helpful for aligning the first and second metallic housing members 31, 32 during mating, as noted above, and as will be appreciated by those skilled in the art.

As pressure is applied to mate the first and second metallic housing members 31, 32, and in particular, as pressure is applied to the gasket 40, the projection 35 and corresponding recess 36 cause the gasket 40 to displace and change shape. In particular, the triangular shape of both the projection 35 and the corresponding recess 36 cause the indium to displace, preferentially, toward the perimeter 44 of the opposing first and second mating surfaces 33, 34, and away from where the projection 35 and corresponding recess 36 mate. As will be appreciated by those skilled in the art, a clamp may be used to apply the pressure to mate the first and second metallic housing members 31, 32.

Since the first and second mating surfaces 33, 34, and the projection 35 and the corresponding recess 36 are continuous, as noted above, the gasket 40 may displace freely to the perimeter 44 without any impediment, for example, bolts, bolt holes. The divergence of the opposing first and second mating surfaces 33, 34 adjacent the perimeter 44 and the divergence of the outer legs 43, 53 advantageously directs displacement of the gasket 40 from compression toward the perimeter 44, and permits access to the gasket for localized heating after it has been displaced by compression, for example. The application of localized heating at the perimeter 44, for example with a soldering iron, to the gasket 40 permits molten indium, to flow back to a gap 48 in the indium where the projection 35 and recess 36 mate (FIG. 4*c*). The flow back from the perimeter 44 is based upon the triangular shape of the protrusion 35 and the recess 36, and more particularly, the divergent outer legs 43, 53. The inner legs 42, 52 both being at right angles from respective mating surfaces 33, 34 advantageously reduce expulsion of the gasket 40 toward the internal chamber, where the electronic circuitry 21 is carried, for example. A solder fill may be added at the divergence of the opposing first and second mating surfaces 33, 34 to occupy any open spaces or voids at the perimeter, for example, as will be appreciated by those skilled in the art.

Advantageously a primary seal is formed by the clamping of the first and second metallic housing members 31, 32 adjacent the projection 35 and recess 36, while a secondary seal is formed from the reflowing, via the localized heating, of the gasket 40 back toward the projection and recess. As will be appreciated by those skilled in the art, as in prior art electronic housings, in particular, hermetically sealed electronic housings, soldering along a perimeter is relatively difficult because the bolts and/or bolt pattern typically block access to the gasket. Thus, to solder the gasket, as in the prior art, the bolts would likely have to be removed.

As will be appreciated by those skilled in the art, the gasket 40 between the first and second housing metallic members 31, 32 is reusable. In other words, once the first and second metallic housing members 31, 32 are separated, the indium may still provide an increased seal between the first and second metallic housing members 31, 32 once they are re-mated. Additional indium may be added to the gasket, as will be appreciated by those skilled in the art, and the steps of applying pressure and localized heating may be repeated.

The electronic device 20 of the present embodiments advantageously provides an increased seal between the metallic housing members 31, 32 without bolts. This allows heating of the indium gasket 40 without removing and replacing bolts. Moreover, the triangular shape of the projection 35 and the recess 36, the continuity of the first and second mating surfaces 33, 34, the divergence of the first and second mating surfaces adjacent the perimeter 44, and the divergence of the outer legs 43, 53 allows the heated indium to flow back into the joint, as will be appreciated by those skilled in the art, thus providing an increased seal.

Typically soft alloy indium seals are increasingly difficult to control in two ways. First, if there is too little indium between the first and second mating portions, an acceptable seal may not be achieved. Second, if there is too much indium between the first and second mating surfaces, excess indium may be expelled, during compression, for example, to an undesirable location within the housing. Because an electronic device being sealed has open electronic circuitry, it may also not be desirable to have conductive indium squeezed into this area.

Additionally, as noted above, a typical electronic device, as in the prior art, uses a perimeter of bolts to compress the seal. The bolts may be effective, but as noted above, they block access to perform localized heating of the gasket 40, for example, providing the secondary seal. Removing these bolts and corresponding bolt holes, as described in the present embodiments, allows increased access to the perimeter 44 of the first and second metallic housing members 31, 32 where the excess indium has been expelled. In conjunction with this, the shape of the projection 35 and recess 36 advantageously directs excess indium mostly in one direction, away from the electronic circuitry 21 and toward the perimeter 44.

Moreover, as will be appreciated by those skilled in the art, in a prior art electronic device, feedthrough pins are relatively close to the seal area, and bolt holes are adjacent to the seal perimeter. When the housing members are compressed much care should be taken to meter the volume of indium because if too much is used, the excess will likely short out the feedthrough pins. In contrast, if too little is used a seal may not be achieved. The projection and recess of such a prior art electronic device provide bi-directional expulsion of the gasket so that the indium expulsion moves inwardly and outwardly in a random manner. Thus, expulsion of the indium in such a prior art electronic device may be increasingly difficult to control.

Still further, on a typical prior art electronic device, the bolts not only compress the two housing members together, but remain to add structural strength. The electronic device 20 of the present embodiments can advantageously be compressed with a hydraulic press, or similar device, or with the use of clamps, for example. Because the electronic device 20 has a secondary seal it may provide enough structural strength without the prior art bolts. By removing the bolts, the electronic device 20 is smaller and weighs less, which may be particularly important, for example, for aerospace applications. If additional structural strength is desired clamps may be added after finishing the secondary seal, as will be appreciated by those skilled in the art.

Figure 5:
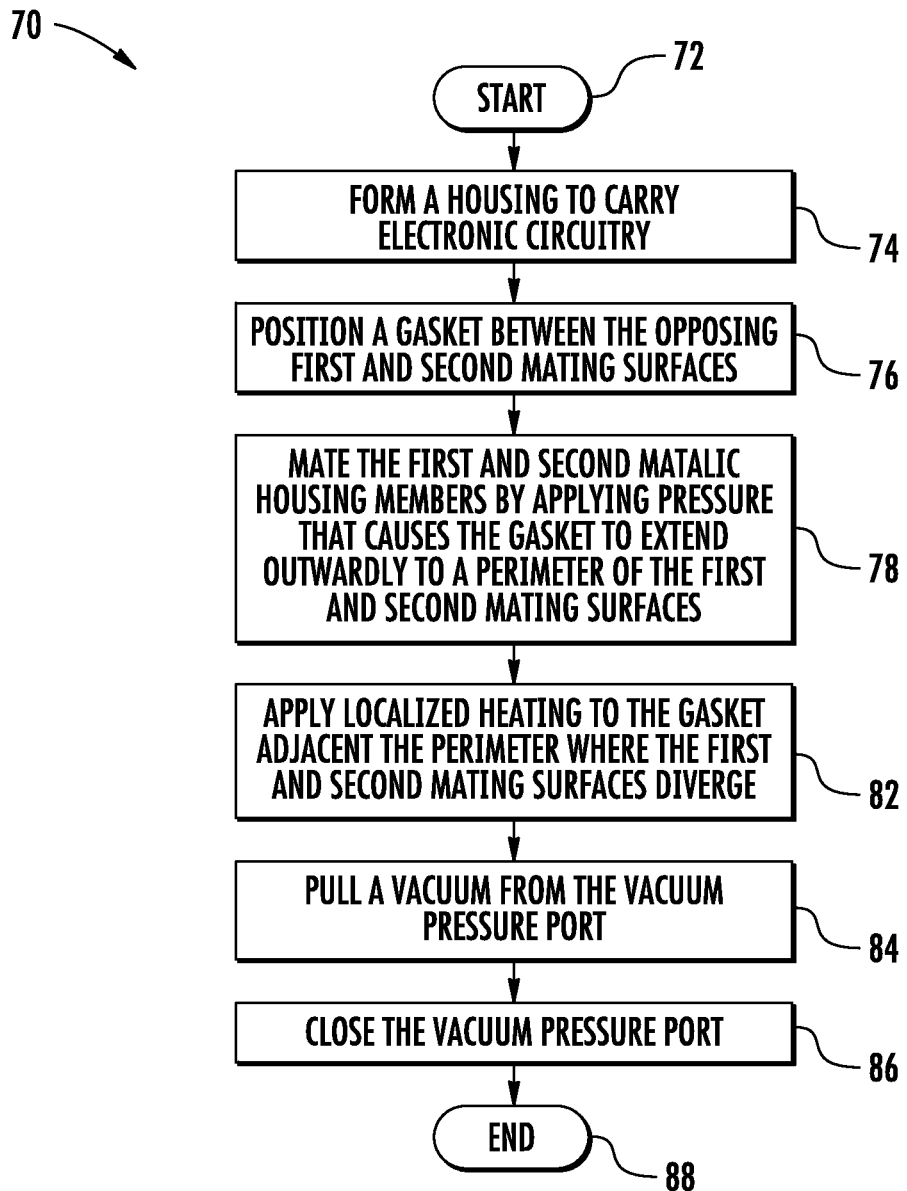
FIG. 5 is a flow chart of a method of making the electronic device of FIG. 1.

Referring now to the flowchart 70 in FIG. 5, beginning at Block 72, a method aspect is directed a method of making an electronic device 20. The method includes, at Block 74 forming a housing 30 to carry electronic circuitry 21. The housing 30 includes first and second metallic housing members 31, 32 having opposing first and second mating surfaces 33, 34 respectively defining a projection 35, and a corresponding recess 36. The method further includes positioning a gasket 40 between the opposing first and second mating surfaces 33, 34 (Block 76). The gasket 40 includes indium.

The method further includes mating the first and second metallic housing members 31, 32 by applying pressure that causes the gasket to extend outwardly to a perimeter 44 of the first and second mating surfaces 33, 34 (Block 78). At Block 82, localized heating is applied to the gasket 40 adjacent the perimeter 44 where the first and second mating surfaces 33, 34 diverge. The localized heating permits the flow of the indium of the gasket 40, and more particularly, flow back to the projection 35 and the corresponding recess 36. At Block 84, a vacuum is pulled from the vacuum pressure port 55. The vacuum pressure port is closed off at Block 86 by clamping, for example. The method ends at Block 88.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
    electronic circuitry;
    a housing carrying said electronic circuitry and comprising first and second metallic housing members having opposing first and second mating surfaces respectively defining a projection and a corresponding recess, the projection being spaced inwardly from a perimeter of said first housing member, and the recess being spaced inwardly from a perimeter of said second housing member; and
    a gasket between the opposing first and second mating surfaces and extending outwardly to the perimeters of the first and second mating surfaces, the gasket comprising indium.

2. The electronic device of claim 1, wherein the opposing first and second mating surfaces diverge outwardly from one another adjacent respective perimeters of said first and second metallic housing members.

3. The electronic device of claim 1, wherein said projection has a triangular profile.

4. The electronic device of claim 3, wherein the triangular profile has an inner leg at a right angle to adjacent portions of the first mating surface.

5. The electronic device of claim 1, wherein the first and second mating surfaces comprise first and second continuous mating surfaces.

6. The electronic device of claim 5, wherein said projection and corresponding recess comprise, respectively, a continuous ring-shaped projection and a continuous ring-shaped recess.

7. The electronic device of claim 5, wherein said gasket comprises a continuous ring-shaped gasket.

8. The electronic device of claim 1, wherein at least one of said first and second metallic housing members comprises a body including a first metal and a coating layer on said body and including a second metal different than the first metal.

9. The electronic device of claim 1, wherein at least one of said first and second metallic housing members further comprises a vacuum pressure port therein.

10. The electronic device of claim 1, wherein each of said first and second metallic housing members comprises at least one of aluminum, titanium, nickel, stainless steel, and an iron-nickel alloy.

11. The electronic device of claim 1, wherein said electronic circuitry comprises an infrared camera; and wherein at least one of said first and second metallic housing members comprises a frame and a light transmissive material window therein aligned with said infrared camera.

12. An electronic device comprising:
    electronic circuitry;
    a housing carrying said electronic circuitry and comprising first and second metallic housing members having opposing first and second continuous mating surfaces respectively defining a triangular-profile projection and a corresponding recess, the triangular-profile projection being spaced inwardly from a perimeter of said first housing member, said triangular-profile projection comprising an inner leg at a right angle to adjacent portions of the first continuous mating surface; and
    a gasket between the opposing first and second continuous mating surfaces and extending outwardly to a perimeters the first and second continuous mating surfaces, the gasket comprising indium.

13. The electronic device of claim 12, wherein the opposing first and second continuous mating surfaces diverge outwardly from one another adjacent respective perimeters of said first and second metallic housing members.

14. The electronic device of claim 12, wherein said triangular-profile projection and corresponding recess comprise, respectively, a continuous ring-shaped projection and a continuous ring shaped recess.

15. The electronic device of claim 12, wherein said gasket comprises a continuous ring-shaped gasket.

16. The electronic device of claim 12, wherein at least one of said first and second metallic housing members comprises a body including a first metal and a coating layer on said body and including a second metal different than the first metal.

17. A method of making an electronic device comprising:
    forming a housing to carry electronic circuitry, the housing comprising first and second metallic housing members having opposing first and second mating surfaces respectively defining a projection and a corresponding recess, the projection being spaced inwardly from a perimeter of the first housing member, and the recess being spaced inwardly from a perimeter of said second housing member; and
    positioning a gasket between the opposing first and second mating surfaces and extending outwardly to the perimeters of the first and second mating surfaces, the gasket comprising indium.

18. The method of claim 17, wherein the opposing first and second mating surfaces diverge outwardly from one another adjacent respective perimeters of the first and second metallic housing members.

19. The method of claim 17, wherein the projection has a triangular profile.

20. The method of claim 19, wherein the triangular profile has an inner leg at a right angle to adjacent portions of the first mating surface.

21. The method of claim 17, wherein the first and second mating surfaces comprise first and second continuous mating surfaces.

22. The method of claim 21, wherein the projection and corresponding recess comprise, respectively, a continuous ring-shaped projection and a continuous ring-shaped recess.

23. The method of claim 21, wherein the gasket comprises a continuous ring shaped gasket.

24. The method of claim 17, wherein at least one of the first and second metallic housing members comprises a body including a first metal and a coating layer on the body and including a second metal different than the first metal.

* * * * *